United States Patent
Chien-Hao et al.

(10) Patent No.: US 9,478,580 B2
(45) Date of Patent: Oct. 25, 2016

(54) GROUNDING SYSTEM FOR INTEGRATED CIRCUITS OF PARTICULAR USEFULNESS FOR CIRCUITS INCORPORATING BACKSIDE-ILLUMINATED PHOTOSENSOR ARRAYS

(71) Applicant: OmniVision Technologies, Inc., Santa Clara, CA (US)

(72) Inventors: Huang Chien-Hao, Hsinchu (TW); Li Ssu-Yi, Hsinchu (TW); Yang Tsung-Ju, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/528,325

(22) Filed: Oct. 30, 2014

(65) Prior Publication Data

US 2016/0126281 A1 May 5, 2016

(51) Int. Cl.
*H01L 27/146* (2006.01)

(52) U.S. Cl.
CPC ..... *H01L 27/14643* (2013.01); *H01L 27/1464* (2013.01); *H01L 27/14612* (2013.01); *H01L 27/14632* (2013.01); *H01L 27/14636* (2013.01); *H01L 27/14687* (2013.01); *H01L 27/14689* (2013.01)

(58) Field of Classification Search
CPC .......... H01L 27/14643; H01L 27/14687; H01L 27/14612; H01L 27/14636; H01L 27/14689; H01L 27/14632; H01L 27/1464
See application file for complete search history.

(56) References Cited

U.S. PATENT DOCUMENTS

| | | | | |
|---|---|---|---|---|
| 2005/0001916 A1* | 1/2005 | Takita | ............... | H04N 5/3575 348/308 |
| 2010/0330728 A1* | 12/2010 | McCarten | ........... | H01L 27/1464 438/70 |
| 2011/0108939 A1* | 5/2011 | Marty | ................ | H01L 27/1463 257/432 |
| 2013/0149866 A1* | 6/2013 | Shriner | ............. | H01J 37/32633 438/694 |

\* cited by examiner

*Primary Examiner* — Marc Armand
*Assistant Examiner* — Sue Tang
(74) *Attorney, Agent, or Firm* — Lathrop & Gage LLP

(57) ABSTRACT

A backside-illuminated photosensor array IC is formed in a thinned circuit wafer. Silicon is removed in at least one substrate-stripped zone where a doped edge-contact ring surrounds the substrate-stripped zone, the edge-contact ring formed in a same first side of the wafer as a plurality of transistors, and opposite to a backside of the wafer. Backside metal is disposed on the backside of the wafer, the backside metal having window openings over the photosensors, and having sidewalls contacting the edge-contact ring around the substrate-stripped zone. The edge contact region is formed in the first side of the device wafer before providing structural support and thinning the device wafer. Substrate-stripped zones, such as bondpad openings and guardring openings, are formed by removing silicon to expose the edge-contact region, and backside metal is deposited with sidewall metal at edges of the substrate-stripped zones and thereby contacting the edge-contact region.

9 Claims, 3 Drawing Sheets

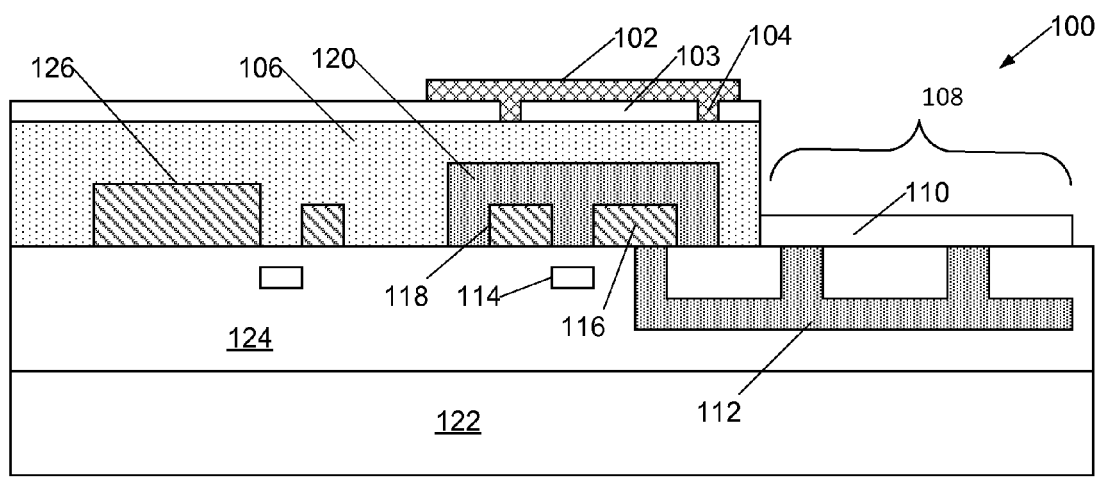
PRIOR ART Fig. 1
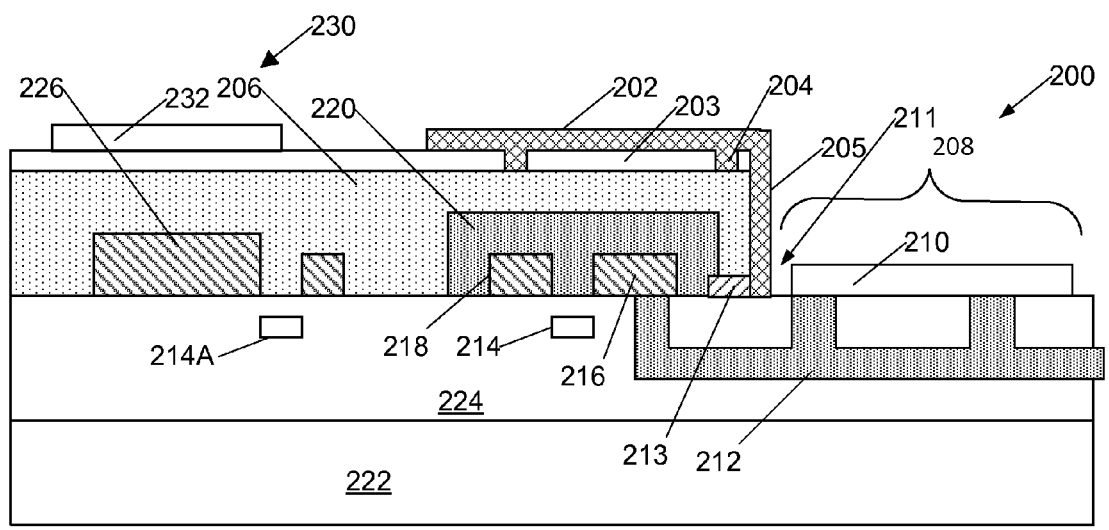
New Device
Fig. 2

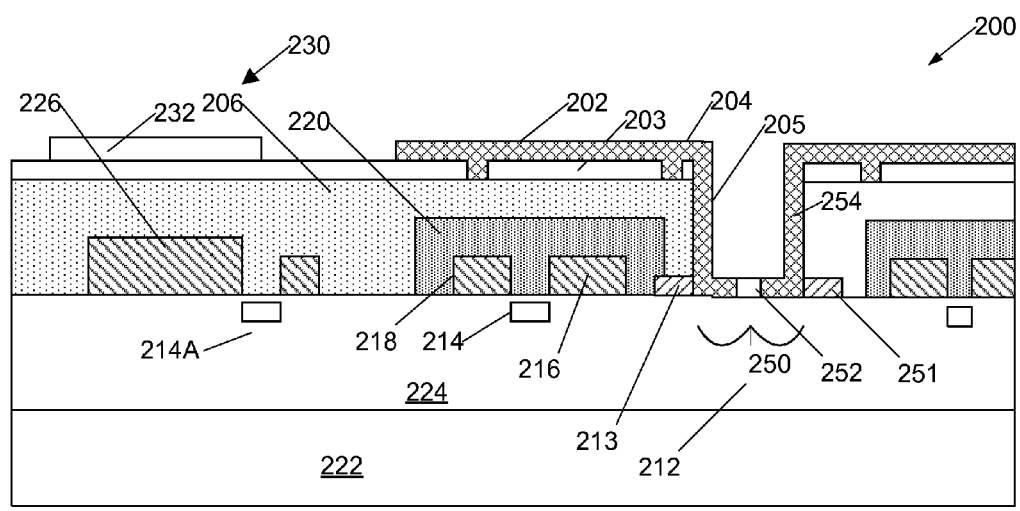
New Device    Fig. 2A
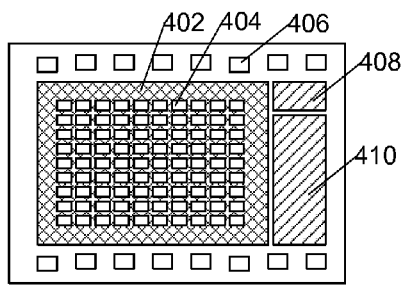
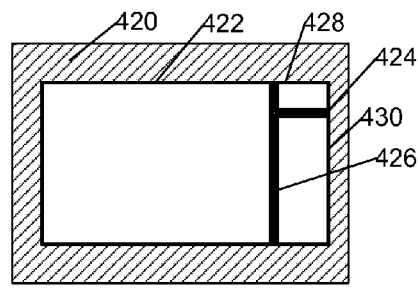
Fig. 2B                Fig. 2C

GROUNDING SYSTEM FOR INTEGRATED CIRCUITS OF PARTICULAR USEFULNESS FOR CIRCUITS INCORPORATING BACKSIDE-ILLUMINATED PHOTOSENSOR ARRAYS

BACKGROUND

Process Damage

Process damage can occur during fabrication processing of integrated circuits, this damage may occur even before protective circuits are fully formed, and may result from charge buildup and induced voltages during ion etching, ion implantation, or other process steps involving plasma and charged-particle beams. This process damage may result from induced voltages on on-chip interconnect or other on-chip metal shapes from radio-frequency fields used to ionize gasses during plasma etching, and for other reasons. This charge must dissipate before it reaches levels that may be fatal to circuit elements.

Process damage may result because large metal shapes on integrated circuits (ICs) can serve as antennae, picking up significant induced voltages during processing, particularly during processing involving radio-frequency fields such as sputtering and plasma etching. These induced voltages have potential for causing circuit damage. For example, photosensor array integrated circuits may have a ring of photon-blocking metal that surrounds the photosensor array itself, covering circuitry that is necessary for overall IC operation but operation of which could be adversely affected by light. Large photon-blocking rings can act as antennas, picking up high induced voltages during processing involving such high radio-frequency fields. Damage caused by high induced voltages may irreparably damage structures, such as by rupturing gate oxides and spiking through contacts, on the integrated circuit during such processing steps including plasma-etching of the large photon-blocking ring, or of sputter deposition of additional layers on the integrated circuit.

Among ways such process damage can be minimized during processing of integrated circuits is ensuring all large shapes on metal layers are coupled to diffused areas on the integrated circuit.

Noise, Stray Charges, and Guardrings

Charges in photosensor array circuits can also arise from photons impacting exposed semiconductor areas of a photosensor array circuit. This includes photosensors of the array as well as surrounding circuitry. If allowed to accumulate, these charges can interfere with circuit operation. Similarly, noise can be coupled into sensitive analog circuitry from switching logic circuits through bondwire resistance and current surges, it can be desirable to isolate portions of an integrated circuit with "guardrings"—structures that separate portions of the circuit into digital and analog regions and which serve to isolate sensitive circuitry by absorbing stray charges, although they need not always form a complete ring around the sensitive circuitry.

Bondpads

It is well known in the integrated circuit art that circuitry coupled to bondpads of integrated circuits (ICs) is susceptible to damage when those bondpads become coupled to external conductors that bear an electrostatic charge; such charged conductors may be parts of component testing, handling or assembly machines, workers that must handle the circuits, curious consumers who handle the parts, or even component storage bags or tubes. Typically, integrated circuit designers incorporate electrostatic-discharge (ESD) protective circuitry intended to dissipate such electrostatic charges without damaging their integrated circuit, and part of reliability testing of ICs involves testing their designs for effectiveness. A common ESD test standardized in JS-001-2012 and MIL-STD-883H models a charged human finger by a 100 pF capacitor and a 1500 ohm discharging resistance. During testing, the fully charged capacitor is discharged through the resistor and through bondwires into a bondpad of the integrated circuit; typical testing involves charging the capacitor to 1500 volts or more. Other ESD test models exist, including a machine model and charged device model; testing to the machine model typically involves coupling a charged capacitor to the circuit with no intervening resistor.

ESD may damage integrated circuits in several ways, many of which are irreversible. For example, gate oxide damage typically results because the very thin oxides used in typical integrated circuits can break down-forming a short circuit-if voltage across the oxide exceeds a breakdown-voltage limit that may, for some circuits, be less than ten volts. ESD discharge can also result in momentary high currents at metal-to-semiconductor contacts in on-chip protective circuitry. High contact current can evaporate metal, leaving an open circuit, or cause enough heating at contacts that semiconductor dissolves into metal, leaving spikes of metal that may extend through shallow integrated circuit junctions leaving a short circuit across the junction.

ESD protective devices are often integrated onto ICs to ensure static charges are dissipated without harm, similarly diffused shapes electrically coupled to large metal shapes are often provided to protect circuits from process-related damage from induced voltages and currents that may be picked up on those metal shapes.

Typically, output pad ESD protection incorporates large transistors located near bonding pads. Large transistors are typically provided to drive high output currents associated with outputting signals onto the bonding pads, but where output transistors are smaller than required to absorb electrostatic discharges, parallel dummy transistors are help conduct electrostatic discharges. Discharges typically pass through metal-to-semiconductor contacts into drain regions of these large transistors, then through paths including source-drain punchthrough to ground or power regions, and thence to ground or power metallization. Another path typically followed by discharge current includes a path through a parasitic junction diode beneath the drain of the large transistor into well or substrate regions, and thence through well or substrate contacts into ground or power metallization, or through well-substrate junctions into substrate, and thence through substrate contacts into ground metallization.

Conventional "bulk" complementary metal oxide semiconductor (CMOS) ICs, as well as front-side-illuminated CMOS photosensor array ICs, often have a fairly thick, conductive, substrate that can form a relatively low-impedance path from the parasitic diode to well or substrate contacts.

Backside Illumination

Backside-illuminated CMOS photosensor array ICs, however, must have the substrate thinned so that light can penetrate that part of the substrate lying beneath photosensors of the array, and thereby reach the photosensors. Thinning may be accomplished by techniques including chemical-mechanical milling and etching. Since thinned wafers are too fragile for processing, a front side of the wafer is reinforced with additional silicon.

Thinned silicon substrate does not, however, have the same conductivity of a full-thickness, un-thinned, wafer. In some prior thinned-wafer, backside-illuminated, photosensor ICs 100, as illustrated in FIG. 1, a backside metallization 102, with backside grounding contacts 104 penetrating a backside dielectric layer 103 to the thinned substrate 106, is used to provide a discharge path for electrostatic discharges, however in some cases current crowding in specific drain contacts during a discharge, whether from ESD or induced voltages during processing, results in circuit damage. Backside metallization 102 also typically serves as a photon blocking layer, with openings over photosensors of the array and photon-blocking metal over non-photosensor devices, such as selection transistors, and over peripheral circuitry, such as row and column counters, decoders and sense amplifiers, associated with the array. Similarly, the backside metallization 102 may block photons from reaching any other circuitry, such as signal processing circuitry, that may be collocated on the photosensor IC. These photosensor ICs may have the original substrate 106 removed in bondpad areas 108 to permit pad metal 110 to have easy access to first layer interconnect metal 112, first layer interconnect metal 112 in turn couples to diffused drain areas 116 of large transistors formed by silicon gate 114 and drain 116, and source 118 diffusions, which may be N+ diffusions lying in an optional well, such as a P well 120. Typically, substrate 106 is weakly P-type, and some output devices typically also have source and drain diffusions that are P+ diffusions lying in N– wells (not shown), as known in the CMOS art. Interconnect metal 112 is in one or more layers of one or more insulating dielectrics 124, which may also contain additional interconnect metal layers, and an additional silicon structural layer 122 is provided to give the device some mechanical strength. An array of photosensors 126, at least part of each photosensor exposed through an opening in backside metal 102, are provided on the circuit to permit imaging.

SUMMARY

A photosensor array integrated circuit configured for backside illumination is formed in a thinned circuit wafer with an array of photosensors. Silicon is removed in at least one substrate-stripped zone, which in an embodiment forms a trench, where a doped edge-contact region adjacent to the substrate-stripped zone, the edge-contact region being formed in a same side of the wafer as a plurality of transistors opposite to a backside of the wafer. Backside metal is disposed on the backside of the wafer, the backside metal having window openings over the photosensors, and having sidewalls contacting the edge-contact region around the substrate-stripped zone.

A method of manufacture of a photosensor array integrated circuit adapted to backside illumination includes forming N-channel MOS (NMOS) transistors in a first side of a device wafer; and forming at least one heavily doped edge contact doped region in the first side of the device wafer. Dielectric layers with contact and via holes are formed over the transistors and edge-contact regions, with photolithographically defined metal interconnect layers. A structural silicon layer is provided, in a particular embodiment by bonding the device wafer to a support wafer, and the device wafer is thinned. At least one substrate-stripped zone is then etched open, removing sufficient silicon to expose the at least one edge-contact region to the substrate-stripped zone, and backside metal is deposited on a second side of the device wafer with sidewall metal at edges of the substrate-stripped zone, the sidewall metal contacting the at least one edge-contact region. The backside metal is photolithographically defined with openings in the backside metal for windows over photosensors and isolation gaps between backside metal and metal.

BRIEF DESCRIPTION OF THE FIGURES

Please note that drawings are not to scale. IC layer thicknesses are exaggerated to show presence of layers, and which layers are contained in other layers, with no attempt to show relative layer depths. Further, in the interest of simplicity, not all layers are shown, deliberately omitted layers include protective oxide or "passivation" layers, many of the metal interconnect layers, and color filter layers.

FIG. 1 is schematic cross sectional diagram illustrating layers of a PRIOR-ART backside-illuminated, silicon, photosensor-array circuit.

FIG. 2 is a schematic cross sectional diagram illustrating layers of an improved backside-illuminated, silicon, photosensor-array circuit.

FIG. 2A is a schematic cross-sectional diagram illustrating layers of the improved backside-illuminated, silicon, photosensor-array circuit in guardring structures surrounding charge-sensitive circuitry that may be integrated on the circuit.

FIG. 2B is a top plan view illustration of an integrated circuit having shapes that may be formed on in backside metal using the grounding method herein described.

FIG. 2C is a top plan view illustration of shapes on a silicon removal mask for the integrated circuit illustrated in FIG. 2B.

DETAILED DESCRIPTION OF THE EMBODIMENTS

Figure 3:
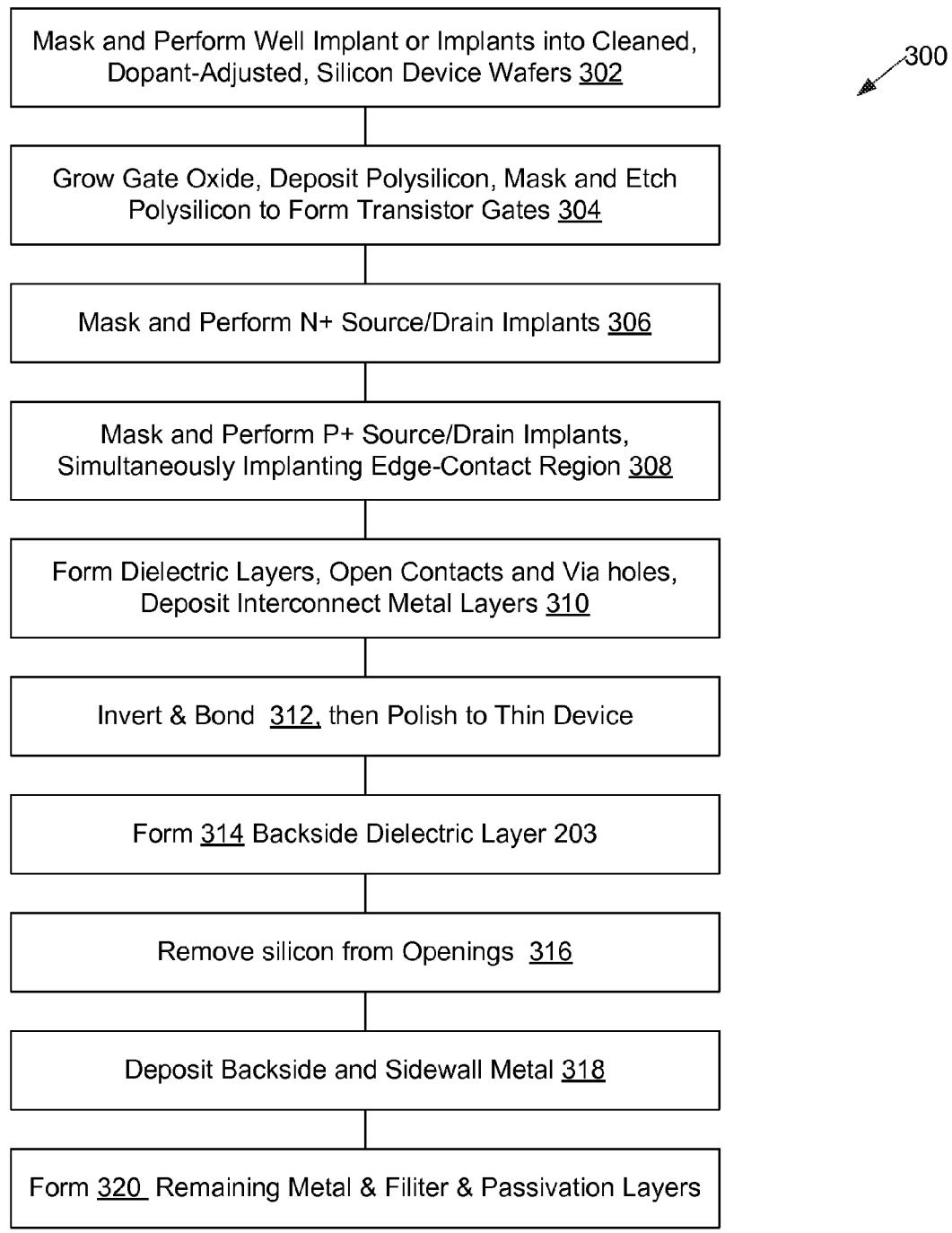
FIG. 3 is a flowchart of a process for fabricating the circuit of FIG. 2.

In an improved thinned-wafer, backside-illuminated, photosensor ICs 200, as illustrated in FIG. 2, a backside metallization 202, which may have some optional backside grounding contacts 204 penetrating a backside dielectric layer 203 to the thinned substrate 206, is used to provide a discharge path for ESD electrostatic discharges. The backside metal is also provided with grounding structures to prevent process-related damage from high currents or voltages that may arise because of induced voltages from nearby radiofrequency (RF) fields during such steps as plasma etching.

Backside metallization 202 serves as a photon blocking layer, with openings over photosensors of the array and photon-blocking metal over non-photosensor devices, such as selection transistors, and over peripheral circuitry, such as row and column counters, decoders and sense amplifiers, associated with the array. Similarly, the backside metallization 102 may block photons from reaching any other circuitry, such as signal processing circuitry, that may be collocated on the photosensor IC. The IC differs from those of FIG. 1 in that backside metallization 202 has a sidewall 205 extending into areas where the original substrate 206 is removed in substrate-stripped zones associated with bondpad areas 208, in trenches 250 (FIG. 2B) of guardring structures, and surrounding backside metal disposed over the photosensor array. The substrate-stripped zones permit sidewalls 205 to contact to contact doped edge-contact regions 213. The substrate-stripped zones also permit pad metal 210 to have easy access to first layer interconnect metal 212.

In some embodiments of bond pad and ESD structures, first layer interconnect metal 212 in turn couples to diffused drain areas 216 of large transistors formed by silicon gate 214, and also by drain 216, and source 218 diffusions, which may be N+ diffusions lying in an optional well, such as a P well 220. Backside metal sidewall 205 is isolated from bondpad metal 210 by a gap 211, which may be protected with a passivation oxide (not shown) that also protects backside metal 202.

Substrate 206 is in a particular embodiment is weakly P-type, and some output devices also have source and drain diffusions that are P+ diffusions lying in N− wells, as known in the CMOS art. In addition to backside metal sidewall 205, a P+ doped edge-contact region 213, which may be formed from the same implant used for P+ source and drain of complementary transistors, is provided along edges of silicon substrate adjacent to substrate-stripped zones 208. A shallow, but heavily P type (P+) doped edge-contact region 213 is formed on a front side of the wafer opposite the back-side metal 202 and sufficiently heavily doped that ohmic contacts form to backside metal sidewall 205 instead of Shottky-barrier contacts. Interconnect metal 212 is in one or more layers of one or more insulating dielectrics 224, which may also contain additional interconnect metal layers, and an additional silicon structural layer 222 is provided to give the device some mechanical strength. An array of photosensors 226, at least part of each photosensor exposed to incoming light through an opening in backside metal 202, are provided on the circuit to permit imaging.

In an alternative embodiment, substrate 206 is weakly N-type and doped edge contact region 213 is N+ type.

Edge-contact implant regions 213 serve to couple large shapes on the backside metal 202 through sidewalls 205 to substrate 206, thereby providing a discharge path to allow dissipation of induced voltages on the backside metal 202 shapes, such as those voltages that may be induced during processing, including plasma etching of those same backside metal shapes and following layers.

The original substrate 206 may be removed to form a trench, and sidewall 205 may be present, to form a guardring 250 (FIG. 2A) about part or all of the photosensor array, or about other charge-sensitive portions, or potentially noisy or charge-leaking sections, of the IC. Areas that may be isolated with a guardring include analog circuitry or dynamic memory circuits such as those that are useful in processing images read from the photosensor array. Edge contact implant regions 213, 251 may be present on both sides of such a guardring. Since particularly noise-sensitive circuits may have a separate power and ground connection, in some, but not all, embodiments guardrings may be formed with a gap 252 such that the sidewall 205 on one side of a guardring is coupled to a separate ground connection than sidewall 254 on another side of the guardring.

In addition to absorbing process-related induced currents, the edge-contact implant regions 213 are also particularly effective at absorbing ESD current surges for large N-channel MOS (NMOS) transistors, such as output driver transistors, formed in the front-side of the wafer and located near the edge-contact region 213.

Device Fabrication Method

Devices according to FIG. 2 are fabricated according to a method 300 (FIG. 3) derived from, but differing from, a traditional method of fabricating the prior backside-illuminated photosensor array of FIG. 1. Silicon device wafers are cleaned, doping adjusted with blanket implants if required, and photolithography and ion-implantation 302 is performed to define ion-implanted well regions, such as P-well 220 and any required N-wells, as known in the CMOS silicon processing art. Next, photoresist is stripped and a thermal gate-oxide is grown 304, and covered with a gate conductor layer, which in some embodiments is a doped polysilicon. The gate conductor layer is then photolithographically etched to form gate shapes 214, 214A. Another photolithographic masking step is then used to define, and an implant performed 306 to form, N+ source/drain implanted regions, such as source 218 and drain 216, additional steps may be performed for threshold adjustment and to provide desired dopant profiles in the transistors thus formed. N-channel, metal-oxide (NMOS) transistors are thereby formed having drain 216, source 218, and gate 214.

In an example embodiment, illustrated in FIG. 2B, a photosensor array mask backside metal shape 402 covers, and thereby prevents light from reaching, peripheral circuitry associated with a photosensor array. Openings 404 in shape 402 are provided so that light may reach photosensors of the photosensor array. Multiple bondpads 406, which need not receive backside metal, are formed on the circuit external to the photosensor array to permit electrical connections to the integrated circuit. Sensitive analog circuitry, such as sense amplifiers, analog scaling circuits, analog portions (such as comparators and resistor strings) of analog-to-digital converters, and color correction circuits, are covered by a backside metal shape 408 to prevent stray photons from interfering with their operation. Digital circuits of the integrated circuit are also covered by a backside metal shape 410. Silicon is selectively removed in areas 420 (FIG. 2C) of bondpads, and in trenches 424, 426 separating backside metal shapes 402, 408, 410 (FIG. 2B), such that sidewalls 422, 428, 430 (FIG. 2C) can form around each backside-metal shape and ground that backside metal through doped edge contact regions to substrate.

Another photolithographic masking step is then used to define, and an implant performed 308 to form P+(heavily P-doped) source/drain ion-implanted doped regions, (not shown), together with P+ edge contact doped regions 213 adjacent to locations where bondpad openings 208, trenches 250, and other areas surrounding large backside metal structures such as photosensor array mask 402 will later be formed. The edge-contact doped regions are preferably continuous along edges of the future bondpad openings near transistors that are coupled to bondpads, but may have gaps and openings elsewhere in the edge-contact region. The edge-contact region may be continuous in some embodiments along guardring structures and along sidewall edges associated with other large backside-metal shapes such as photosensor array masks, and in some embodiments may be interrupted along guardrings and large backside-metal shapes.

A repeated sequence of at least forming a dielectric layer 310, opening contact or via holes in the dielectric layer, depositing a metal layer such as interconnect metal 212, and photolithographically defining metal shapes on the metal layer, is performed until all required metal interconnect layers are formed. In some embodiments, each metal layer may be formed of multiple layers, including conductor and barrier metal layers; and in some embodiments chemical mechanical polishing is performed to limit step coverage and planarize the device surface.

The device wafer is then inverted and bonded 312 to a carrier wafer that provides structural silicon layer 222, and chemical-mechanical polishing is performed to thin the device wafer such that light of desired wavelengths can penetrate the wafer to reach photosensors 206 of the photosensor array formed in the wafer. In an alternative embodiment, structural silicon layer 222 is built up on the wafer with thick chemical-vapor depositions. A backside dielectric 203 is formed 314 after the device wafer is thinned.

Scribe lines, trenches, and bondpad openings 208, and other areas where silicon of the original substrate are to be removed are then opened 316 by photolithography and selective etch removal of overlying oxide and silicon substrate, the resulting substrate-stripped zones 208 exposing the P+ edge-contact regions. In some embodiments, backside metal contact openings 204 are formed in backside dielectric 203. Backside metal is then deposited 318 by a method, such as but not limited to organometallic chemical vapor deposition, that permits deposition of sidewall metal simultaneously with backside metal, openings on this metal layer are photolithographically defined, including locations of windows 230 over photosensors 226 and isolation gaps 211. Any required remaining layers, including additional bondpad metal 210, color filter 232 layers, and passivation layers, are then formed 320 and lithographically defined.

Combinations

The features and methods herein described may be performed in various combinations without detracting from the spirit of the invention herein described. A few such example combinations are described here:

A photosensor array integrated circuit designated A, the circuit configured for backside illumination, has transistors in a thinned circuit wafer with an array of photosensors. Silicon is removed in at least one substrate-stripped zone where the doped edge-contact region is adjacent the substrate-stripped zone, the edge-contact region being formed in a same side of the wafer as a plurality of transistors opposite to a backside of the wafer. Backside metal is disposed on the backside of the wafer, the backside metal having window openings over the photosensors, and having sidewalls contacting the edge-contact region around the substrate-stripped zone.

ESD Protection

A photosensor array designated AA including the photosensor array designated A wherein at least some of the plurality of transistors are large transistors formed near the edge-contact region and coupled to bondpad metallization through an interconnect metallization.

A photosensor array designated AB including the photosensor array designated A or AA where the transistors are CMOS transistors.

A photosensor array designated AC including the photosensor array designated A, AA, or AB wherein the edge-contact ring is continuous along at least one large NMOS transistor, the NMOS transistor having a drain coupled by interconnect metal to the bondpad metallization.

Photosensor Array Mask

A photosensor array designated AD including the photosensor array designated A wherein the backside metal has at least one shape that covers peripheral circuits associated with a photosensor array of the integrated circuit, the shape having openings over photosensors of the array, and the doped edge-contact region and sidewall forms a ring surrounding the photosensor array.

A photosensor array designated ADA including the photosensor array designated AD or A wherein the doped edge-contact region is more heavily P doped than the P doped original substrate.

Guardrings

A photosensor array designated AE including the photosensor array designated AD or A wherein at least one substrate-stripped zone where silicon is removed has form of a trench separating a noise-sensitive portion of the integrated circuit from another portion of the integrated circuit, the sidewalls extending along sides of the trench.

A photosensor array designated AEA including the photosensor array designated AE wherein the A photosensor array designated ADA including the photosensor array designated AD or A backside metal is separated into a first and a second shape by a gap along a bottom of the trench.

Manufacture

A method designated B of manufacture of a photo sensor array integrated circuit adapted to backside illumination includes forming N-channel MOS (NMOS) transistors in a first side of a device wafer; and forming at least one heavily P-doped edge contact doped region in the first side of the device wafer. Dielectric layers with contact and via holes are formed over the transistors and edge-contact regions, with photolithographically defined metal interconnect layers. A structural silicon layer is provided, in a particular embodiment by bonding the device wafer to a support wafer, and the device wafer is thinned. At least one substrate-stripped zone is then etched open, removing sufficient silicon to expose the at least one edge-contact region to the substrate-stripped zone, and backside metal is deposited on a second side of the device wafer with sidewall metal at edges of the substrate-stripped zone, the sidewall metal contacting the at least one edge-contact region. The backside metal is photolithographically defined. In a particular embodiment, the backside metal is defined with openings for windows over photosensors and isolation gaps between backside metal and other first-level metal, such as bondpad metal or interconnect metal, that may be present in substrate-stripped zones.

A method designated BA including the method designated B wherein forming the structural layer is performed by inverting the device wafer and bonding the device wafer to a support wafer.

A method designated BB including the method designated B, or BA wherein the step of opening the substrate-stripped zone includes removing at least a portion of the device wafer.

A method designated BC including the method designated B, BA, or BB further comprising forming P-channel transistors in the device wafer, the photosensor array integrated circuit being a CMOS integrated circuit.

It will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method of manufacture of a photosensor array integrated circuit adapted to backside illumination comprising:
   forming N-channel MOS (NMOS) transistors in a first side of a device wafer;
   forming at least one heavily P-doped edge contact doped region, the heavily P-doped edge contact region formed in the first side of the device wafer;
   performing at least one metallization sequence comprising
      1) forming a dielectric layer on the first side of the device wafer,
      2) opening holes in the dielectric layer on the first side of the device wafer,
      3) depositing a metal layer on the first side of the device wafer, and
      4) photolithographically defining metal shapes on the metal layer on the first side of the device wafer;
   providing a structural layer, and thinning a second side of the device wafer;
   opening at least one substrate-stripped zone by removing silicon of the device wafer and exposing the at least one heavily P-doped edge-contact doped region to the substrate-stripped zone, the substrate-stripped zone associated with a bondpad;
   depositing backside metal on the second side of the device wafer with sidewall metal at edges of the substrate-stripped zone, the sidewall metal contacting the at least one heavily P-doped edge-contact doped region; and
   defining openings in the backside metal for windows over photosensors and isolation gaps between backside metal and other metal of the integrated circuit.

2. The method of claim 1 wherein forming the structural layer is performed by inverting the device wafer and bonding the device wafer to a support wafer.

3. The method of claim 2 wherein the step of opening the substrate-stripped zone includes removing at least a portion of the device wafer.

4. The method of claim 2 further comprising forming P-channel transistors in the device wafer, the photosensor array integrated circuit being a CMOS integrated circuit.

5. The method of claim 1 wherein photolithographically defining openings includes the use of plasma etching to define the openings in the backside metal.

6. A method of manufacture of a photosensor array integrated circuit adapted to backside illumination comprising:
   forming N-channel MOS (NMOS) transistors in a first side of a device wafer;
   forming at least one heavily P-doped edge contact doped region, the heavily P-doped edge contact region formed in the first side of the device wafer;
   performing at least one metallization sequence comprising
      1) forming a dielectric layer on the first side of the device wafer,
      2) opening holes in the dielectric layer on the first side of the device wafer,
      3) depositing a metal layer on the first side of the device wafer, and
      4) photolithographically defining metal shapes on the metal layer on the first side of the device wafer;
   providing a structural layer, and thinning a second side of the device wafer;
   opening at least one substrate-stripped zone by removing silicon of the device wafer and exposing the at least one heavily P-doped edge-contact doped region to the substrate-stripped zone;
   depositing backside metal on the second side of the device wafer with sidewall metal at edges of the substrate-stripped zone, the sidewall metal contacting the at least one heavily P-doped edge-contact doped region; and
   defining openings in the backside metal for windows over photosensors and isolation gaps between backside metal and other metal of the integrated circuit, the defining openings including plasma etching of openings in the backside metal;
   wherein the connection between the heavily P-doped edge-contact doped region and the backside metal provides grounding of the backside metal during the plasma etching.

7. The method of claim 6 wherein forming the structural layer is performed by inverting the device wafer and bonding the device wafer to a support wafer.

8. The method of claim 6 wherein the step of opening the substrate-stripped zone includes removing at least a portion of the device wafer.

9. The method of claim 6 further comprising forming P-channel transistors in the device wafer, the photosensor array integrated circuit being a CMOS integrated circuit.

* * * * *